United States Patent
Haba et al.

(10) Patent No.: US 6,853,557 B1
(45) Date of Patent: Feb. 8, 2005

(54) MULTI-CHANNEL MEMORY ARCHITECTURE

(75) Inventors: Belgacem Haba, Cupertino, CA (US); Sayeh Khalili, San Jose, CA (US); Donald R. Mullen, Mountain View, CA (US); Nader Gamini, Monte Sereno, CA (US)

(73) Assignee: Rambus, Inc., Los Altos, CA (US)

( * ) Notice: Subject to any disclaimer, the term of this patent is extended or adjusted under 35 U.S.C. 154(b) by 368 days.

(21) Appl. No.: 09/665,920

(22) Filed: Sep. 20, 2000

(51) Int. Cl.$^7$ .................................................. H05K 7/02
(52) U.S. Cl. ........................ 361/760; 361/777; 174/261
(58) Field of Search ................................ 361/760, 777, 361/783–785, 790, 803; 257/723; 174/261; 365/51, 52, 63

(56) References Cited

U.S. PATENT DOCUMENTS

| | | | | |
|---|---|---|---|---|
| 4,567,545 A | * | 1/1986 | Mettler, Jr. ................ | 174/50.5 |
| 5,117,389 A | * | 5/1992 | Yiu ............................. | 365/104 |
| 5,379,438 A | * | 1/1995 | Bell et al. ................... | 395/800 |
| 5,708,297 A | * | 1/1998 | Clayton ...................... | 257/723 |
| 5,943,573 A | * | 8/1999 | Wen ............................ | 438/275 |
| 5,952,691 A | * | 9/1999 | Yamaguchi ................. | 257/316 |
| 6,005,776 A | * | 12/1999 | Holman et al. ............. | 361/760 |
| 6,049,467 A | * | 4/2000 | Tamarkin et al. .......... | 174/52.4 |
| 6,111,757 A | * | 8/2000 | Dell et al. ................... | 361/737 |
| 6,172,895 B1 | | 1/2001 | Brown et al. | |
| 6,233,157 B1 | * | 5/2001 | Yoon et al. .................. | 361/760 |
| 6,253,266 B1 | * | 6/2001 | Ohanian ...................... | 710/301 |
| 6,388,886 B1 | * | 5/2002 | Tobita ......................... | 361/760 |
| 6,590,781 B2 | * | 7/2003 | Kollipara et al. ........... | 361/760 |

OTHER PUBLICATIONS

"Product Comparison and Drawing". AMP Incorporated, Memory Socket 821850–2, 2 pages, (no date).

"AMP Micro–Edge SIMM Connector Module Board Insertion and Removal Procedures", IS 9413, pp. 1–3, Jul. 18, 1991.

* cited by examiner

Primary Examiner—Kamand Cuneo
Assistant Examiner—Thanh S. Phan
(74) Attorney, Agent, or Firm—Lee & Hayes, PLLC (57) ABSTRACT

A memory architecture includes a first substrate containing multiple memory devices and a first channel portion extending across the first substrate. The architecture further includes a second substrate containing multiple memory devices and a second channel portion extending across the second substrate. A connector couples the first channel portion to the second channel portion to form a single channel. The connector includes a first slot that receives an edge of the first substrate and a second slot that receives an edge of the second substrate. Another connector has a pair of slots that receive opposite edges of the first and second substrates. The channel portions extend across the substrates in a substantially linear path. Each channel portion includes multiple conductors having lengths that are approximately equal.

26 Claims, 6 Drawing Sheets

Fig. 7

MULTI-CHANNEL MEMORY ARCHITECTURE

TECHNICAL FIELD

The present invention relates to memory systems and, in particular, to a multi-channel memory architecture that provides increased communication bandwidth and provides communication channels having conductors of substantially equal length.

BACKGROUND

In recent years, DRAM (dynamic random access memory) technology has progressed dramatically. Device storage capacities have increased from 1 Kbits per chip to 64 Mbits per chip, a factor of 64,000. However, DRAM performance has not maintained pace with these density changes, since access times have decreased by a factor of approximately five. During this same time period, microprocessor performance has increased by several orders of magnitude. This disparity between the speed of the microprocessors and the access time associated with DRAMs has forced system designers to create a variety of expensive and often complicated hierarchical memory techniques, such as SRAM (static random access memory) caches and parallel arrays of DRAMs. Some high performance graphics systems rely on expensive frame buffers to provide the necessary bandwidth for communicating with the memory devices.

Rambus Inc. has developed a new chip-to-chip bus, referred to as the "Direct Rambus Channel", that operates up to ten times faster than conventional DRAMs. The Direct Rambus Channel (the channel) connects memory devices to other devices such as microprocessors, digital signal processors, graphics processors and ASICs (application-specific integrated circuits). The channel uses a small number of very high speed signals to carry all address, data, and control information.

Figure 1:
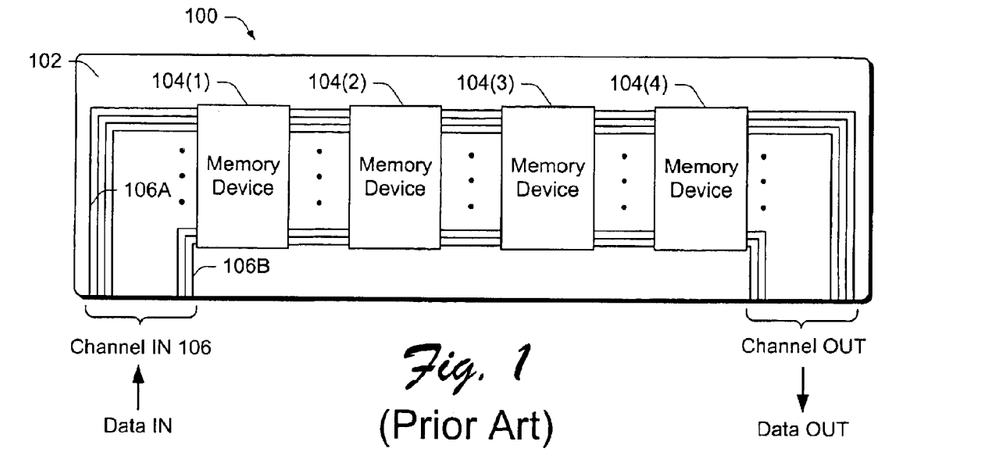
FIG. 1 illustrates a known memory module containing multiple memory devices and a single channel coupling the memory devices to one another.

FIG. 1 illustrates a known memory module 100 containing multiple memory devices and a single channel coupling the memory devices to one another. Memory module 100 typically includes a substrate 102, such as a multi-layered printed circuit board (PCB) that supports multiple memory devices 104 mounted to the substrate. In this example, each memory device 104 is a Rambus DRAM (or "RDRAM®"), developed by Rambus Inc. of Mountain View, Calif. The memory devices are coupled to one another by a Direct Rambus Channel 106. Data flows into channel 106 on the left side of module 100, as oriented in FIG. 1. Data flows along channel 106, past the four RDRAMs 104, and out the right side of module 100. In a typical configuration, one or more modules 100 are supported by a motherboard (not shown), which includes a memory controller. Each of the four RDRAMs 104 can retrieve data from channel 106 and transmit data to other devices using channel 106.

Channel 106 shown in FIG. 1 provides a high bandwidth communication path for address, data, and control information associated with one or more of the four RDRAMs 104. Channel 106 includes multiple conductors, two of which are identified by the reference numbers 106A and 106B. As shown in FIG. 1, the channel conductors follow a ninety degree bend at each end of the substrate 102. Thus, the lengths of the various conductors in channel 106 are not equal. For example, the length of conductor 106A is greater than the length of conductor 106B in the same channel. This unequal routing of conductors in channel 106 causes problems with the timing of signals propagating on the channel because different signals arrive at memory device 104(1) at different times due to the unequal conductor lengths. Similarly, the conductors between memory device 104(4) and the channel output are unequal in length, leading to timing problems with signals on the channel output. To compensate for the unequal channel conductor lengths, the conductors may be routed on substrate 102 in such, a manner that each conductor is approximately the same length. Attempting to route conductors such that each conductor is approximately the same length is tedious and time-consuming. Additionally, such routing of conductors increases the cost and complexity of the substrate 102 (e.g., by requiring additional layers of conductors and additional vias between layers).

Alternatively, if the channel conductors are maintained at unequal lengths, then the processing of signals from the channel must be delayed for a period of time that allows the signal on the longest conductor to reach the appropriate device (e.g., memory device). This alternative slows the operation of the overall memory system by causing an added delay to compensate for the worst case delay on the channel.

The memory module 100 shown in FIG. 1 is also limited to a single channel 106 on each side of the substrate 102 (i.e., a maximum of two channels per memory module). Thus, all memory devices on one side of the substrate 102 share a common channel, which is limited to a particular bandwidth. The speed at which data can be stored to or retrieved from the memory devices 104 is limited by the bandwidth of the single channel.

The memory architecture described herein addresses these and other problems by providing an architecture in which all channel conductors are substantially the same length. Further, the memory architecture described herein supports the use of multiple channels on each side of a substrate, thereby increasing the overall bandwidth.

SUMMARY

In one embodiment, a memory architecture includes a substrate having a first elongated edge and a second elongated edge in which the two elongated edges are opposite one another. Multiple memory devices are disposed on the substrate. Multiple channels extend from the first elongated edge to the second elongated edge such that each of the multiple memory devices is coupled to one of the multiple channels.

In another embodiment, multiple channels extend across both sides of the substrate.

In a particular implementation, each channel includes multiple conductors that follow a substantially linear path across the substrate.

In a described embodiment, each channel includes multiple conductors that are approximately equal in length.

Another embodiment provides a first substrate containing multiple memory devices and a first channel portion extending across the first substrate. A second substrate also contains multiple memory devices and a second channel portion extending across the second substrate. A connector is configured to couple the first channel portion to the second channel portion. The connector includes a first slot that receives an edge of the first substrate and a second slot that receives an edge of the second substrate.

In a particular embodiment, the coupling of the first channel portion to the second channel portion through the connector forms a channel

DETAILED DESCRIPTION

The multi-channel memory architecture described herein provides increased bandwidth by providing additional communication channels on each memory module. These additional channels increase the overall bandwidth of the memory module. Additionally, the described memory architecture routes the channel conductors such that each channel has conductors of substantially equal length. This routing of the channel conductors simplifies the layout of the conductors on the substrate and eliminates the need for special timing consideration caused by channel conductors of unequal length.

Figure 2:
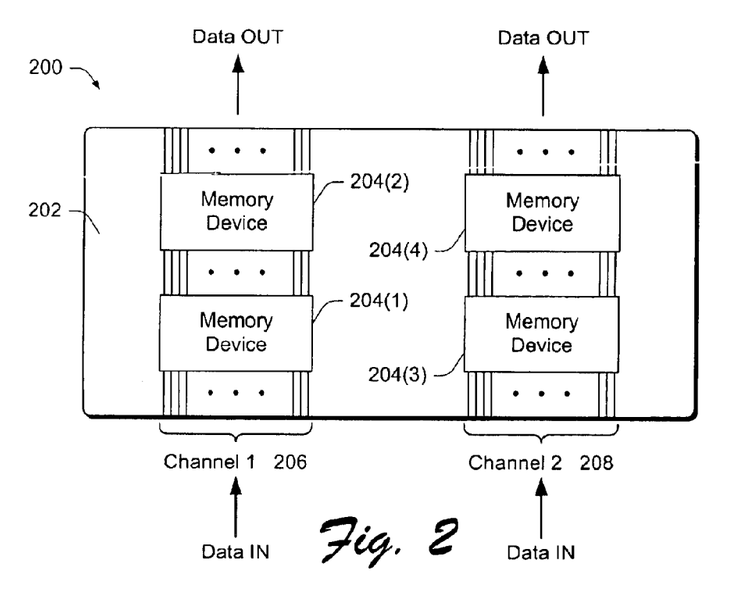
FIG. 2 illustrates another memory module having multiple channels in which all channel conductors are substantially the same length.

FIG. 2 illustrates another memory module 200 having multiple channels in which all channel conductors are substantially the same length. Memory module 200 eliminates the ninety degree bend in the channel conductors, thereby eliminating the associated problems, such as the timing problems caused by channel conductors of different length. Additionally, memory module 200 provides for two separate channels 206 and 208 that extend across the memory module in parallel with one another. These two channels provide increased bandwidth for communicating data and other information between the various memory devices 204. Each memory device 204 is coupled to its associated channel such that each of the pins or contacts of the memory device make an electrical connection with a corresponding hole or pad on a substrate 202, such as a printed circuit board. In a particular embodiment, memory devices 204 are surface mount components coupled to both outer surfaces of substrate 202 (i.e., the surface that can be seen in FIG. 2 and the surface on the opposite side of the substrate).

Channels 206 and 208 receive data as indicated in FIG. 2, propagate that data along the channel and past the two memory devices 204. The data is then propagated out the top portion of memory module 200 (as oriented in FIG. 2). As shown in FIG. 2, the channel conductors extend substantially linearly from one edge of substrate 202 to the opposite edge of the substrate. In one embodiment, the top and bottom edges of substrate 200 have electrical contacts or pads (not shown) that allow the channel conductors to communicate with another device, such as a connector designed to receive the edge of the substrate.

In a particular embodiment, channels 206 and 208 are coupled to memory devices 204 located on both sides of the substrate 202. For example, four 11 additional memory devices may be located opposite the four memory devices 204(1)–204(4) shown on one side of substrate 202. This configuration allows four memory devices 204 to be coupled to each channel 206 and 208. In another embodiment, two additional channels and corresponding memory devices are located on the opposite side of substrate 202. In this embodiment, four channels extend across substrate 202.

Figure 3:
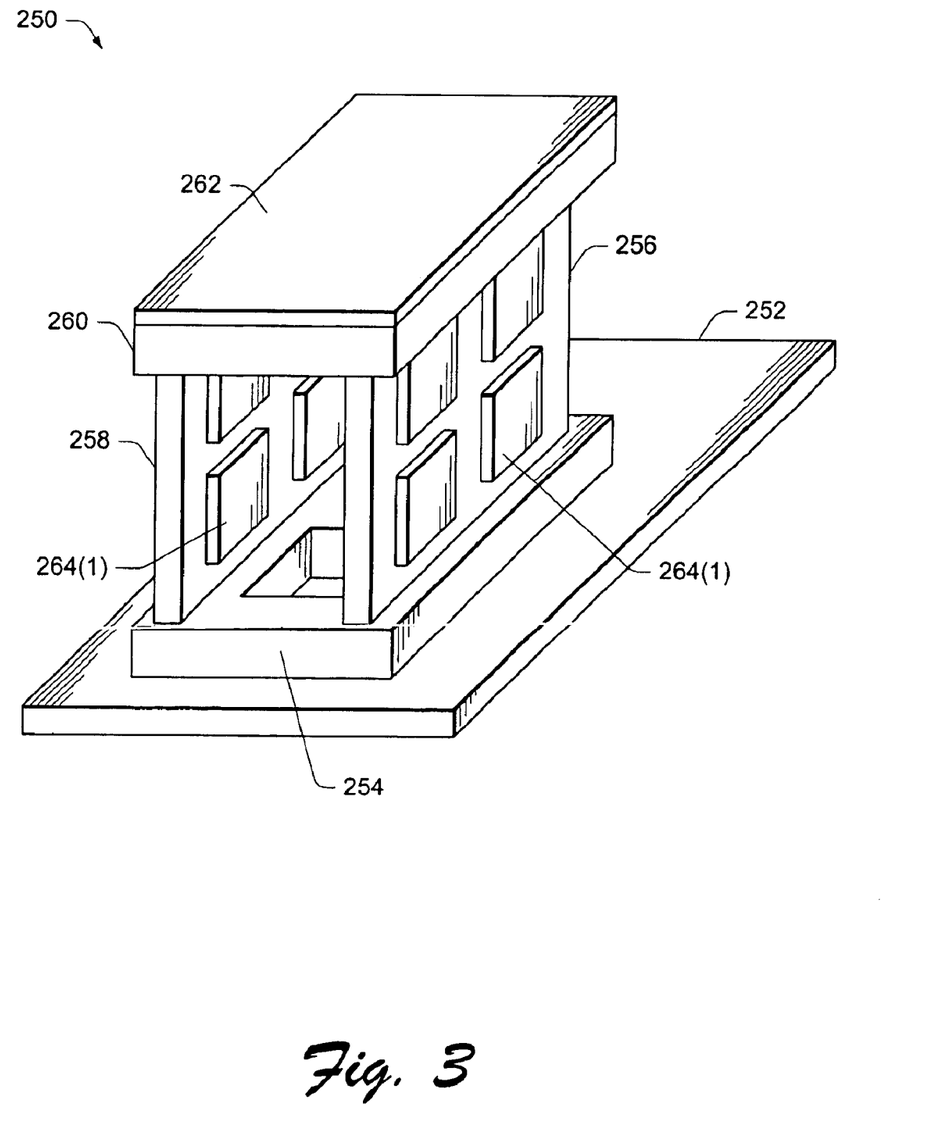
FIG. 3 illustrates a perspective view of a memory architecture including a pair of memory modules and a pair of connectors to couple the memory modules to one another.

FIG. 3 illustrates a perspective view of a memory architecture 250 including a pair of memory modules and a pair of connectors to couple the memory modules to one another. The memory architecture 250 includes a connector 254 mounted to a substrate 252, such as a motherboard or other printed circuit board. A pair of memory modules 256 and 258 each engage slots in connector 254. Each memory module 256, 258 includes multiple memory devices 264 mounted on one or both sides of the memory module. Another connector 260 is coupled, via two slots, to the two memory modules 256 and 258. Connector 260 is also mounted to a substrate 262, which includes electrical conductors (e.g., traces) which communicate signals between the two memory modules 256 and 258.

Figure 4:
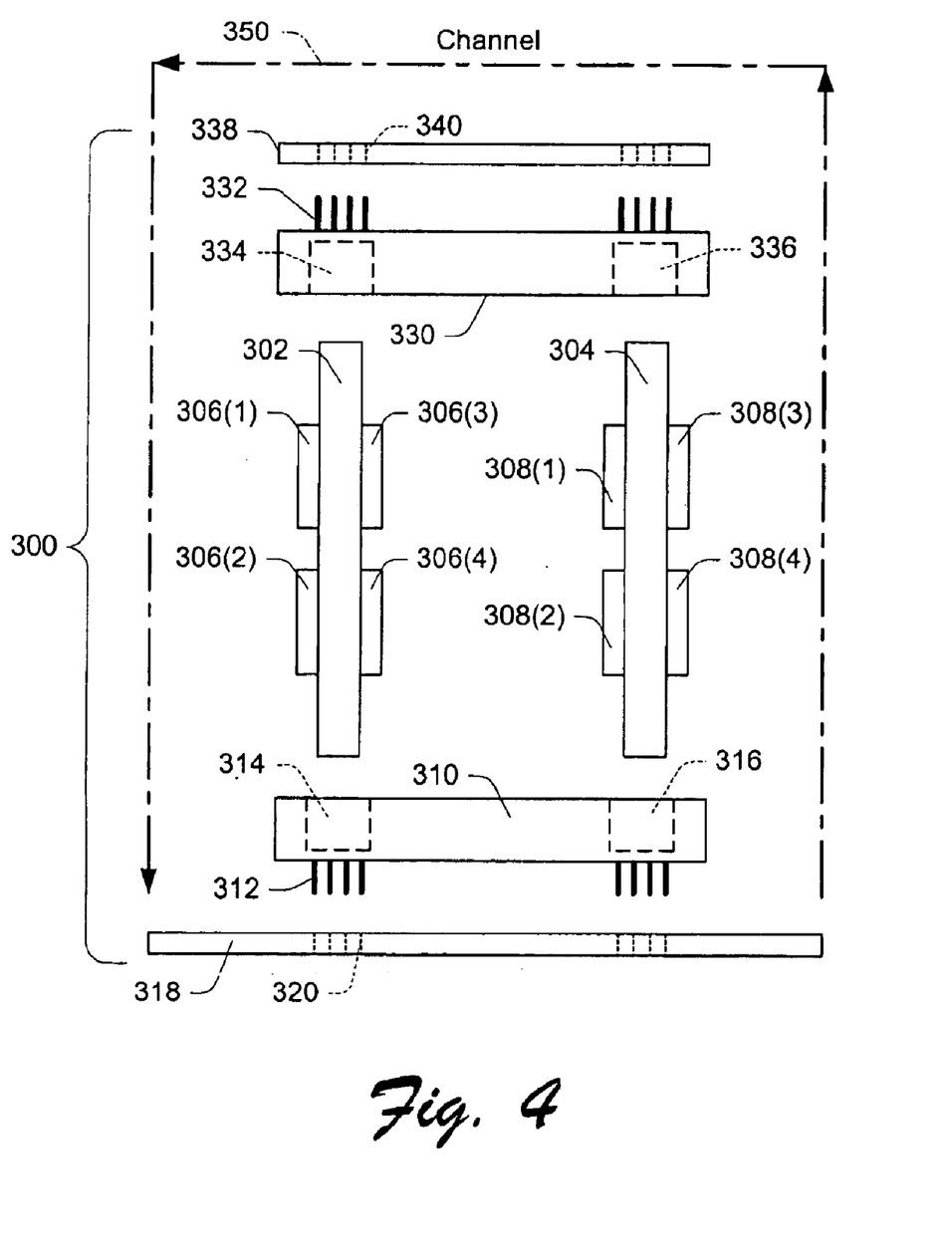
FIG. 4 illustrates an exploded view of the memory architecture shown in FIG. 3.

FIG. 4 illustrates an exploded view of the memory architecture shown in FIG. 3. A pair of memory modules 302 and 304 each contain multiple memory devices 306 and 308, respectively. In one embodiment, memory modules 302 and 304 are similar to memory module 200 described above with respect to FIG. 2. In this embodiment, each memory module 302 and 304 contains eight memory devices 306 or 308 (i.e., four memory devices on each side of the memory module). The memory architecture contains two channels, each of which follows a channel path 350.

A connector 310 is configured to receive the two memory modules 302 and 304 such that the electrical contacts (not shown) on the lower edge of each memory module engage a corresponding set of electrical contacts or pads (not shown) in the connector 310. Memory module 302 is inserted into a slot 314 in connector 310 and memory module 304 is inserted into a slot 316 in connector 310. The electrical contacts in connector 310 are positioned along the inner surface of slots 314 and 316, as discussed below with reference to FIG. 5. In a particular embodiment, memory modules 302 and 304 are interchangeable.

Connector 310 includes multiple conductive pins 312 extending from the bottom of the connector (i.e., the side of the connector opposite the slots 314 and 316). The conductive pins 312 engage multiple corresponding apertures (or through-holes) 320 in a substrate 318, such as a printed circuit board. In a particular embodiment, substrate 318 is a motherboard containing a central processing unit (CPU), memory controller, and other components necessary to provide the desired computing functions. Additionally, the motherboard has multiple connectors 310 for receiving multiple pairs of memory modules 302 and 304. Depending on the memory storage required, some or all of the connectors 310 are populated with memory modules. Memory capacity can be increased in the future by inserting one or more additional pairs of memory modules in unused connectors 310.

Another connector 330 engages the top edge of each memory module 302 and 304. As discussed above with respect to FIG. 2, the top edge of each memory 8 module also includes multiple electrical contacts or pads. These electrical contacts engage corresponding electrical contacts or pads (not shown) in connector 330. Connector 330 includes a slot 334 to receive memory module 302 and another slot 336 to receive memory module 304. The electrical contacts in connector 330 are located along the inner surface of slots 334 and 336, as discussed below with reference to FIG. 5.

Connector 330 also includes multiple conductive pins 332 extending from the connector opposite the openings of slots 334 and 336. The conductive pins 332 engage multiple corresponding apertures (or through-holes) 340 in a substrate 338, such as a printed circuit board. In one embodiment, substrate 338 has a footprint approximately the same size as connector 330. The substrate 338 includes multiple conductors for connecting the channel conductors on memory module 302 to corresponding channel conductors on module 304. The multiple conductors are arranged such that all conductors for a particular channel are approximately the same length.

As discussed with respect to FIG. 2, each memory module 302 and 304 may have two channels extending across the memory module, each channel terminating at opposite edges of the memory module. Connector 330 and substrate 338 provide a mechanism for communicating signals between the top edge conductors on each of the memory modules 302 and 304, thereby allowing each of the channels to extend across both memory modules 302 and 304, and back to the substrate 318 (e.g., the motherboard).

For example, broken line 350 (FIG. 4) shows a possible channel path 350. In this example, the channel data is received from substrate 318, through connector 310, and communicated to memory module 304 using the electrical contacts in slot 316 and along the edge of the memory module. The channel continues vertically upward along memory module 304 to connector 330, where the data signals are communicated to the substrate 338. The multiple conductors on (or in) substrate 338 extend the channel across the substrate 338 to the slot 334 which provides a connection to memory module 302. The channel then continues vertically downward along memory module 302 to connector 310, where the data signals are communicated back to substrate 318. Thus, a single channel is established by the communication of connector 310, memory modules 302 and 304, connector 330 and substrate 338. These separate portions may be referred to as "channel portions" which are combined to create a channel. Any number of channel portions can be coupled to one another to create a channel.

In a particular embodiment, the memory architecture 300 includes four channels, all of which follow the same path 350. In this embodiment, two channels follow the outer sides of memory modules 302 and 304 (i.e., communicating with memory devices 308(4), 308(3), 306(1), and 306(2)). The other two channels follow the inner sides of memory modules 302 and 304 (i.e., communicating with memory devices 308(2), 308(1), 306(3), and 306(4)). In alternate embodiments, channels my alternate between inner and outer sides of the memory modules, thereby providing two channels.

As described above, each channel "flows" from right to left (i.e., beginning at memory module 304 and ending at module 302). However, it will be apparent to those skilled in the art that one or more channels can flow in the opposite direction (i.e., beginning at memory module 302 and ending at memory module 304). Additionally, examples described herein contain a particular number of 8 memory devices (e.g., four) on each side of a memory module. However, alternate embodiments may contain any number of memory devices on each side of a memory module. Further, each side of a memory module may contain a different number of memory modules and/or a different number of channels. A particular embodiment may contain memory devices only on one side of the memory module. Another embodiment may contain one or more channels only on one side of the memory module. A particular channel may be coupled to any number of memory devices arranged on any number of different memory modules.

The embodiment of FIG. 4 illustrates connectors 310 and 330 as having pins that engage through holes in the corresponding substrate 318 or 338. In an alternate embodiment, connectors 310 and 330 are surface mount components mounted to and making electrical contact with the surface of substrate 318 or 338. In other embodiments, any mounting system can be used to mount connectors 310 and 330 to corresponding substrates 318 and 338.

Figure 5:
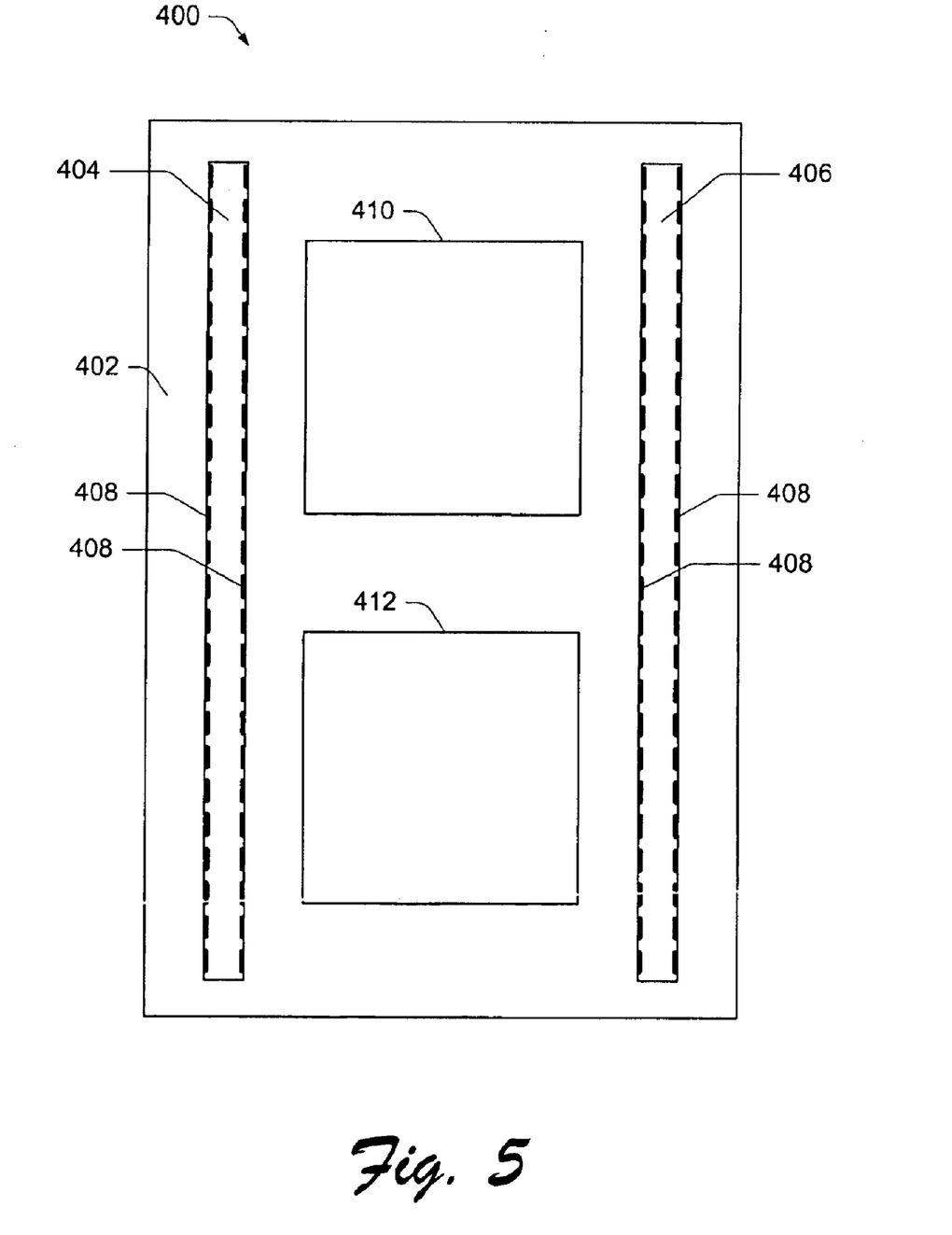
FIG. 5 is a top view of a connector used to couple two memory modules to one another.

FIG. 5 is a top view of a connector 400 used to couple two memory modules to one another. Connector 400 corresponds to connectors 310 and 330 discussed above with respect to FIG. 4. Connector 400 includes a body portion 402, typically made of plastic or another insulating material. Connector 400 includes two slots 404 and 406 to receive memory modules or other devices having an edge (e.g., the edge of a substrate) with dimensions and electrical contacts that correspond to the dimensions and electrical contacts of the slots. Each slot 404 and 406 includes multiple electrical contacts or pads 408 along the elongated inner edges of the slots. The size, shape, and spacing of electrical contacts 408 are shown as an example only. Alternate connectors may have any number of electrical contacts of any size and shape, and arranged in any manner.

Connector 400 also includes a pair of openings 410 and 412 in the body 402 of the connector. These openings reduce the amount of material required to manufacture the body 402 and provides visibility through the connector 400 to the attached substrate (not shown). Alternate embodiments may omit one or both of the openings 410 and 412. The same type of connector 400 is used on both edges of a pair of memory modules. Since both slots 404 and 406 are molded or otherwise formed into the same connector, the alignment of the two memory modules with the two slots should be in proper registration. This single connector 400 with two slots 404 and 406 eliminates the need to provide two separate connectors (each with one slot) and align the two connectors on the substrate such that the memory modules are in proper alignment.

Figure 6:
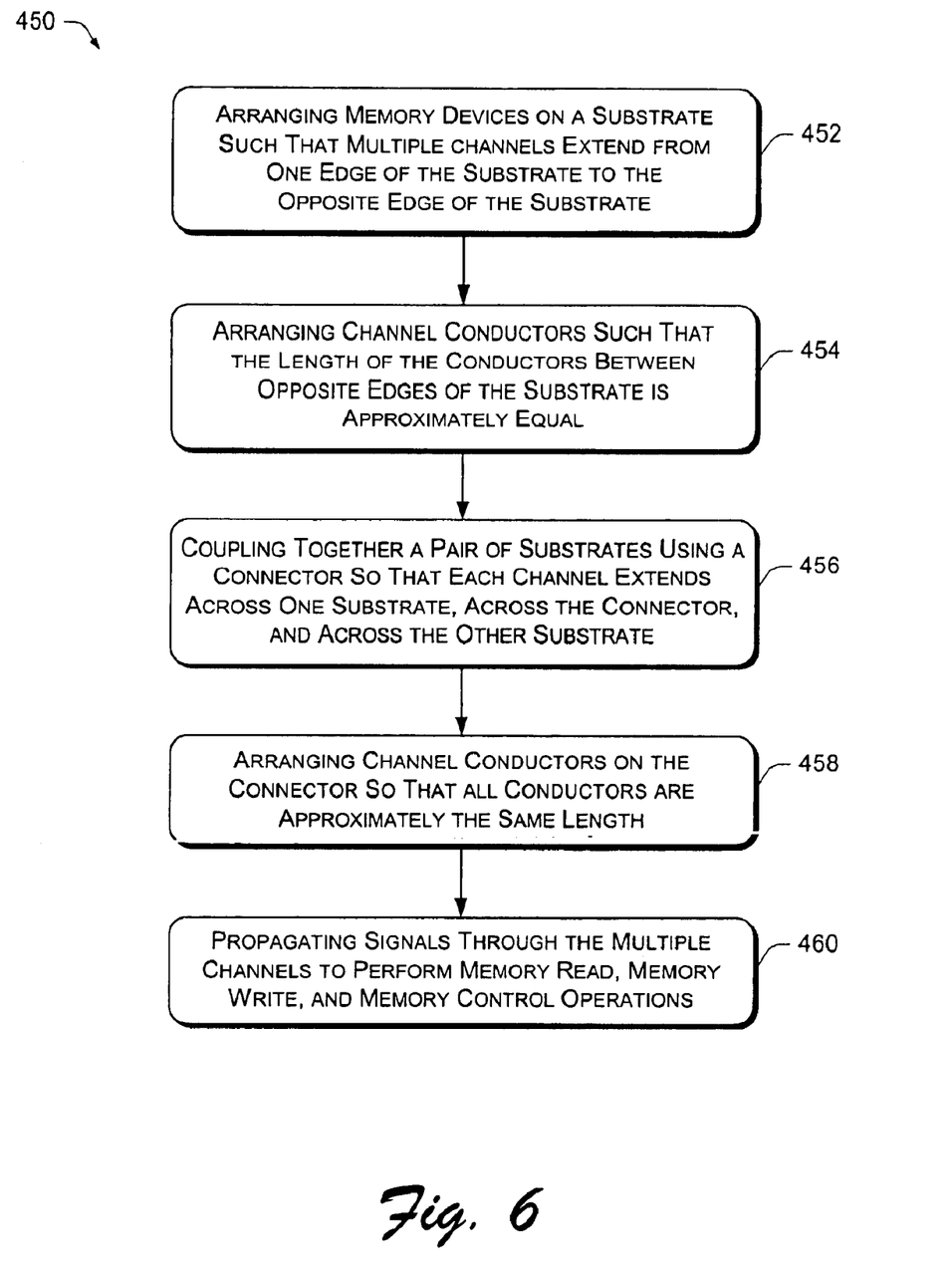
FIG. 6 is a flow diagram illustrating a procedure for creating and using a memory architecture of the type described herein.

FIG. 6 is a flow diagram illustrating a procedure 450 for creating and using a memory architecture of the type described herein. Multiple memory devices (e.g., RDRAMs) are arranged on a substrate such that multiple channels extend from one edge of the substrate to the opposite edge of the substrate (block 452). Typically, the substrate is rectangular (i.e., having two longer (or elongated) sides or edges). In a particular embodiment, the multiple channels extend from one elongated edge to the opposite elongated edge, as shown in FIG. 2. The channel conductors are arranged such that the length of the conductors between opposite edges of the substrate is approximately equal (block 454). Further, the channel conductors extend substantially linearly from one edge of the substrate to the opposite edge of the substrate.

A pair of substrates are coupled together using a connector so that each channel extends across a first substrate, across the connector, and across a second substrate (block 456). The channel conductors are arranged on the connector such that all conductors for a particular channel are approximately the same length (block 458). Signals are propagated through the multiple channels to perform memory read, memory write, and memory control operations (block 460).

Figure 7:
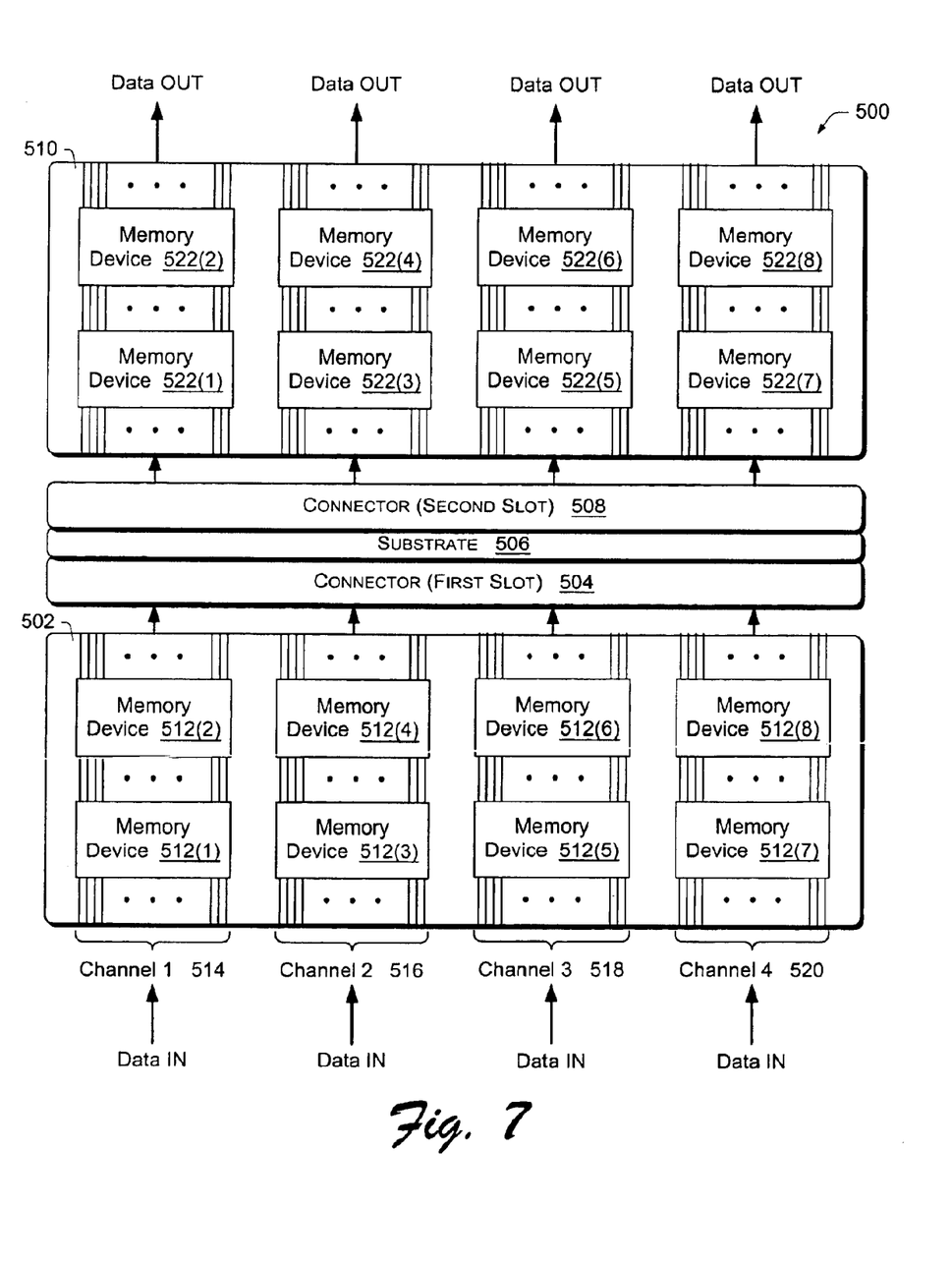
FIG. 7 illustrates another embodiment of a memory architecture having multiple channels in which all channel conductors are substantially the same length.

FIG. 7 illustrates another embodiment of a memory architecture 500 having multiple channels in which all channel conductors are substantially the same length. Memory architecture 500 includes four channels that extend across each substrate in parallel with one another. The four channels increase the overall bandwidth available for reading data, storing data, and performing various memory control operations. A first memory module 502 contains eight memory devices 512 on each side of the memory module. Memory module 502 can receive data (including instructions) on four different channels 514, 516, 518, and 520. In an alternate embodiment, an additional four channels (not shown) are located on the opposite side of memory module 502.

Memory module 502 is coupled to a first slot 504 in a connector. The connector is coupled to a substrate 506, such as a printed circuit board. A second slot 506 in the connector receives a second memory module 510. Memory module 510 includes multiple memory devices 522. As shown in FIG. 7, the four channels 514–520 extend across the first memory module 502, across substrate 506, and across the second memory module 510. In this arrangement, the conductors of each channel are substantially the same length. Further, the channel conductors follow a substantially linear path across each substrate 502, 506, and 510. A particular channel may have any number of memory devices and have conductors of any length.

Thus, a system has been described that provides a multi-channel memory architecture having channel conductors of substantially equal length. Although the description above uses language that is specific to structural features and/or methodological acts, it is to be understood that the invention defined in the appended claims is not limited to the specific features or acts described. Rather, the specific features and acts are disclosed as exemplary forms of implementing the invention.

What is claimed is:

1. An apparatus comprising:
    a substrate having first and second opposite edges;
    a plurality of memory devices disposed on the substrate;
    a plurality of channels extending between the opposite edges, wherein each memory device of the plurality of memory devices is coupled to one channel of the plurality of channels; and
    electrical contacts at the opposite edges of the substrate configured to allow communications throughout the channels via the electrical contacts, wherein the substrate has a first side and a second side, the plurality of memory devices being disposed on both sides of the substrate.

2. An apparatus as recited in claim 1 wherein each channel includes a plurality of conductors, the plurality of conductors following a substantially linear path across the substrate.

3. An apparatus as recited in claim 1 wherein each channel includes a plurality of conductors, the plurality of conductors having lengths that are approximately equal.

4. An apparatus comprising:
    a substrate having first and second opposite edges;
    a plurality of memory devices disposed on the substrate;
    a plurality of channels extending between the opposite edges, wherein each of the plurality of memory devices is coupled to one of the plurality of channels; and
    electrical contacts at the opposite edges of the substrate configured to allow communications through the channels via the electrical contacts, wherein the substrate has a first side and a second side, the plurality of channels extending across both sides of the substrate.

5. An apparatus as recited in claim 4 wherein both sides of the substrate have memory devices mounted on them.

6. An apparatus as comprising:
    a first substrate having a plurality of memory devices disposed thereon and a first channel portion extending across the first substrate, the first substrate having opposite ends and contacts at the opposite ends to allow communications through the first channel portion via the contacts at the opposite ends of the first substrate;
    a second substrate having a plurality of memory devices disposed thereon and a second channel portion extending across the second substrate, the second substrate having opposite ends and contacts at the opposite ends to allow communications through the second channel portion via the contacts at the opposite ends of the second substrate;
    a first connector configured to communicatively couple the first channel portion to the second channel portion through at least some of the contacts of the first and second substrates, wherein the first connector engages contacts at a first of the ends of the first substrate and engages contacts at a first of the ends of the second substrate, and
    a third substrate coupled to the first connector.

7. An apparatus as recited in claim 6 wherein the coupling of the first channel portion to the second channel portion through the connector forms a channel.

8. An apparatus as recited in claim 6 wherein the first channel portion includes a plurality of conductors following a substantially linear path across the first substrate.

9. An apparatus as recited in claim 6 wherein the second channel portion includes a plurality of conductors following a substantially linear path across the second substrate.

10. An apparatus as recited in claim 6 wherein the first channel portion includes a plurality of conductors having lengths that are approximately equal.

11. An apparatus as recited in claim 6 wherein the second channel portion includes a plurality of conductors having lengths that are approximately equal.

12. An apparatus as recited in claim 6 wherein the third substrate includes a third channel portion extending across the third substrate.

13. An apparatus as recited in claim 6 wherein the third substrate includes a third channel portion extending across the third substrate, the third channel portion including a plurality of conductors following a substantially linear path across the third substrate.

14. An apparatus as recited in claim 6 wherein the third substrate includes a third channel portion extending across the third substrate, the third channel portion including a plurality of conductors having lengths that are approximately equal.

15. An apparatus as recited in claim 6 further including a second connector that engages contacts at a second of the ends of the first substrate and engages contacts at a second of the ends of the second substrate.

16. An apparatus as recited in claim 15 wherein the second connector is coupled to a motherboard.

17. A method comprising:
    arranging channel portions on a substrate such that the channel portions extend between opposite edges of the substrate;
    arranging contacts at the opposite edges of the substrate to allow communication between the contacts at the opposite edges through the channel portions;
    arranging channel portion conductors such that the length of the channel portion conductors between opposite edges of the substrate is approximately equal; and coupling together a pair of such substrates using a connector, a channel extending across the pair of substrates and the connector, wherein channel portions are arranged on both sides of the substrate.

18. A method as recited in claim 17 further including propagating signals through the channel.

19. A method as recited in claim 17 further including arranging a plurality of memory devices on the substrate such that each memory device is coupled to a channel portion.

20. A method as recited in claim 19 further including propagating signals through the channel portions to perform memory operations.

21. A method as recited in claim 17 wherein each channel portion includes a plurality of conductors, each of the conductors having approximately equal lengths along the entire length of the channel portion.

22. A method as recited in claim 17 wherein each channel portion includes a plurality of conductors following a substantially linear path across the substrate.

23. A memory module comprising:

a substrate having opposite ends and at least one surface;

contacts at the opposite ends of the substrate;

one or more memory devices mounted to the surface of the substrate; and one or more communication channel portions extending across the module between the contacts, the one or more communication channel portions being configured to allow communications through the contacts with the one or more memory devices, wherein the substrate has opposing surfaces, and the one or more memory devices comprise at least one memory device mounted on each of the opposing surfaces of the substrate.

24. A memory module comprising:

a substrate having opposite ends and at least one surface;

contacts at the opposite ends of the substrate;

one or more memory devices mounted to the surface of the substrate; and one or more communication channel portions extending across the module between the contacts, the one or more communication channel portions being configured to allow communications through the contacts with the one or more memory devices, wherein the substrate has opposing surfaces, and the one or more communication channel portions comprise at least one communication channel portion extending across each of the opposing surfaces of the substrate.

25. A memory module as recited in claim 24, wherein each communication channel portion comprises a plurality of conductors that follow a substantially linear path across the substrate.

26. A memory module as recited in claim 24, wherein each communication channel portion comprises a plurality of conductors having lengths that are approximately equal.

* * * * *